(12) United States Patent
Yamaura

(10) Patent No.: US 9,190,933 B2
(45) Date of Patent: Nov. 17, 2015

(54) ELECTRIC POWER CONVERTER HAVING PLURALITY OF SEMICONDUCTOR MODULES ARRAYED IN SUCCESSIVE LAYERS

(71) Applicant: DENSO CORPORATION, Kariya, Aichi-pref. (JP)

(72) Inventor: Satoshi Yamaura, Kariya (JP)

(73) Assignee: DENSO CORPORATION, Kariya (JP)

( * ) Notice: Subject to any disclaimer, the term of this patent is extended or adjusted under 35 U.S.C. 154(b) by 405 days.

(21) Appl. No.: 13/672,870

(22) Filed: Nov. 9, 2012

(65) Prior Publication Data

US 2013/0121052 A1    May 16, 2013

(30) Foreign Application Priority Data

Nov. 11, 2011   (JP) .................... 2011-247391

(51) Int. Cl.
| | |
|---|---|
| H05K 7/20 | (2006.01) |
| H02M 7/537 | (2006.01) |
| G06F 1/20 | (2006.01) |
| H02M 7/162 | (2006.01) |
| H01L 23/473 | (2006.01) |
| H02M 7/00 | (2006.01) |
| H02B 1/01 | (2006.01) |
| H01L 23/02 | (2006.01) |
| H01L 23/34 | (2006.01) |

(52) U.S. Cl.
CPC ............ *H02M 7/537* (2013.01); *G06F 1/20* (2013.01); *H01L 23/473* (2013.01); *H02M 7/003* (2013.01); *H02M 7/162* (2013.01)

(58) Field of Classification Search
CPC ... H01L 23/473; G06F 1/20; G06F 2200/201; H02M 7/162
USPC .......... 361/688, 689, 699, 715, 831; 257/686, 257/712, 724; 363/141, 131, 132
See application file for complete search history.

(56) References Cited

U.S. PATENT DOCUMENTS

| | | | |
|---|---|---|---|
| 2011/0261600 A1* | 10/2011 | Tachibana | ..................... 363/131 |
| 2012/0300522 A1 | 11/2012 | Tokuyama et al. | |

FOREIGN PATENT DOCUMENTS

| | | |
|---|---|---|
| JP | 2007-329509 | 12/2007 |
| JP | 2011-077464 | 4/2011 |
| JP | 2011-135737 | 7/2011 |
| JP | 2011-167056 | 8/2011 |

OTHER PUBLICATIONS

Office Action (2 pages) dated Aug. 20, 2013, issued in corresponding Japanese Application No. 2011-247391 and English translation (3 pages).

* cited by examiner

*Primary Examiner* — Hoa C Nguyen
*Assistant Examiner* — Binh Tran
(74) *Attorney, Agent, or Firm* — Nixon & Vanderhye P.C.

(57) ABSTRACT

In an electric power converter, a stacked-layer unit has a plurality of semiconductor modules arrayed as layers along a stacking direction, each semiconductor module containing a semiconductor element and a pair of power terminals protruding outward in a protrusion direction at right angles to the stacking direction, each pair consisting of an AC terminal and a positive-polarity or negative-polarity power terminal. The semiconductor modules are arranged with the positive-polarity and negative-polarity power terminals in a single column at one side of the stacked-layer unit, and respectively connected to a positive-polarity busbar and negative-polarity busbar which are located at that side and which are separated by a fixed spacing in the protrusion direction, while the AC terminals of each layer-adjacent pair of semiconductor modules are connected in common to a corresponding one of a plurality of AC busbars.

4 Claims, 9 Drawing Sheets

ELECTRIC POWER CONVERTER HAVING PLURALITY OF SEMICONDUCTOR MODULES ARRAYED IN SUCCESSIVE LAYERS

CROSS-REFERENCE TO RELATED APPLICATIONS

This application is based on and incorporates herein by reference Japanese Patent Application No. 2011-247391 filed on Nov. 11, 2011.

BACKGROUND OF THE INVENTION

1. Field of Application

The present invention relates to an electric power converter having a plurality of semiconductor modules arrayed in successive layers, each semiconductor module having an internal semiconductor element and two power terminals.

2. Background Technology

Types of electric power converter are known, for converting between DC power and AC power, based on a stacked-layer unit having a plurality of successive layers of semiconductor modules, each semiconductor module incorporating an internal semiconductor element and two power terminals, and a plurality of cooling tubes arranged in layers corresponding to those of the semiconductor modules, for cooling the semiconductor modules. An example of such an electric power converter is described in Japanese patent publication No. 2011-135737, referred to in the following as reference D1.

FIG. 9 is a plan view illustrating the electric power converter of reference D1, and FIG. 8 is a corresponding plan view with a positive-polarity busbar 93a and negative-polarity busbar 93b removed. As shown in FIG. 9, the electric power converter 9 incorporates a stacked-layer unit 910 having alternating layers of cooling tubes 911 and semiconductor modules 92, held within a rectangular frame 96, with the semiconductor modules 92 each having a pair of power terminals collectively designated by numeral 921. The power terminals of each semiconductor module 92 consist of an AC terminal 921c (for supplying AC power to a load) and either a positive-polarity power terminal 921a or a negative-polarity power terminal 921b (for connection to the positive-polarity or negative-polarity side of a DC power source, respectively). The semiconductor modules 92 are arranged in successive layers each containing two semiconductor modules, thereby forming two columns of semiconductor modules each extending along the x-direction (i.e., the stacking direction). In each layer, the positive-polarity power terminal 921a of one semiconductor module 92 is connected to the positive-polarity busbar 93a, the negative-polarity power terminal 921b of the other semiconductor module 92 is connected to the negative-polarity busbar 93b, and the two AC power terminals 921c of that layer are connected in common to a corresponding one of a set of three AC busbars 94.

Respective end portions of the AC busbars 940 constitute external connection terminals 940, which are mounted on a terminal strip 95, for connecting to an external apparatus such as a 3-phase AC motor (not shown in the drawings). Two terminals 950 of a smoothing capacitor (not shown in the drawings) are also mounted on the terminal strip 95, with the external connection terminals 940 and capacitor terminals 950 arrayed in a single column along the x-direction as shown.

The terminal strip 95 is positioned adjacent to one side of the frame 96 (with respect to the y-direction, i.e., width direction), oriented along the x-direction. Due to the column of terminals which are mounted on the terminal strip 95 and the necessary spacings between these, the length of the terminal strip 95 along the x-direction must be made relatively large. However since the semiconductor modules 92 are arranged in two columns, the stacked-layer unit 910 is relatively short as measured along the x-direction, so that the length L1 of the frame 96 is relatively small. Thus there is a mismatch between the length L2 of the terminal strip 95 and the length L1 of the frame 96. This results in a dead space (unoccupied space) S shown in FIG. 9, which is a hindrance to minimizing the overall size of the electric power converter 9.

In addition with such a configuration, the AC busbars must be formed with respectively different shapes. This is a hindrance to reducing the manufacturing costs of the electric power converter 9 by minimizing the number of different component parts. In addition, since each AC busbar must reach both of the AC power terminals 921c in the corresponding layer of semiconductor modules 92, the AC busbars are substantially elongated. Furthermore if the overall (y-direction) width of the electric power converter 9 is minimized as far as possible, the AC busbars become spaced closely together. Hence, at least a part of each AC busbar must be made substantially narrow, to prevent contact between adjacent busbars. Such an elongated narrow shape of the AC busbars is disadvantageous from the aspects of increased electrical resistance and difficulty of forming the AC busbars (e.g., from sheet metal).

SUMMARY

Hence it is desired to overcome the above problem, by providing an electric power converter which can be made more compact and can be manufactured at lower cost than has been possible with a prior art configuration such as that described above.

In the following description and in the appended claims, "connected" is to be understood as signifying "electrically connected", unless otherwise indicated. The term "tube" is used to refer to a structure which forms a flow passage for a coolant, and is not restricted to any specific internal or external shape.

The invention provides an electric power converter based on a stacked-layer unit, consisting of a plurality of semiconductor modules and a plurality of coolant flow passages formed in coolant tubes, with the semiconductor modules being arrayed as layers along a stacking direction, disposed such that the semiconductor modules are cooled by a flow of a coolant through the coolant flow passages. Each semiconductor module incorporates an internal semiconductor device and a pair of power terminals which protrude externally along a protrusion direction, at right angles to the stacking direction (column direction), each pair of power terminals being mutually adjacent with respect to the width direction (i.e., a direction at right angles to the stacking direction and to the protrusion direction). The converter further includes positive-polarity and negative-polarity busbars which carry a DC current, and a plurality of AC busbars for carrying AC currents, with the busbars connected to predetermined ones of the power terminals. A terminal strip is disposed adjacent to one side of the stacked-layer unit, with respect to the width direction, having respective external connection terminals of the AC busbars mounted thereon, arrayed in a single column, along the stacking direction.

The electric power converter is characterized in that the semiconductor modules form a single column, extending along the stacking direction. Two columns of power terminals are thus formed, each extending along the stacking direction, with a first power terminal column located adjacent to the first side of the stacked-layer unit (i.e., close to the terminal strip), and the second power terminal column being adjacent to the opposite side of the stacked-layer unit from the first side. Each AC busbar is connected to a respective AC terminals (i.e., within the first power terminal column) of a corresponding pair of layer-adjacent semiconductor modules. In the second power terminal column, the positive-polarity power terminals and negative-polarity power terminals occur in successive alternation. The negative-polarity and positive-polarity busbars are mutually separated by a fixed spacing with respect to the protrusion direction, are located adjacent to the first side of the stacked-layer unit, and are respectively connected to each of the negative-polarity power terminals and to each of the positive-polarity power terminals.

With such a configuration, the length of the stacked-layer unit along the stacking direction becomes substantially longer than for the case in which the semiconductor modules are arrayed as a plurality of (side-by-side) columns each extending in the stacking direction, as with the prior art example described above. At the same time, the width of the stacked-layer unit is reduced. The electric power converter thereby becomes more compact, since the wasted space (dead space) described hereinabove can be eliminated.

In addition, as is made clear by a description hereinafter of embodiments, such a configuration enables each of the AC busbars to be made of identical shape and size, so that manufacturing costs can be lowered, and also enables each AC busbar to be short in length, thereby lowering electrical resistance. Furthermore due to the reduced length, the amount of metal used to form each AC busbar can be reduced, further enabling manufacturing costs to be lowered.

Furthermore during manufacture, it becomes possible to handle the positive-polarity busbar, negative-polarity busbar and AC busbars in combination as a single component, at the time of installing these and connecting to the power terminals of the semiconductor modules. Manufacturing efficiency can thus be enhanced.

DESCRIPTION OF PREFERRED EMBODIMENTS

First Embodiment

Figure 1:
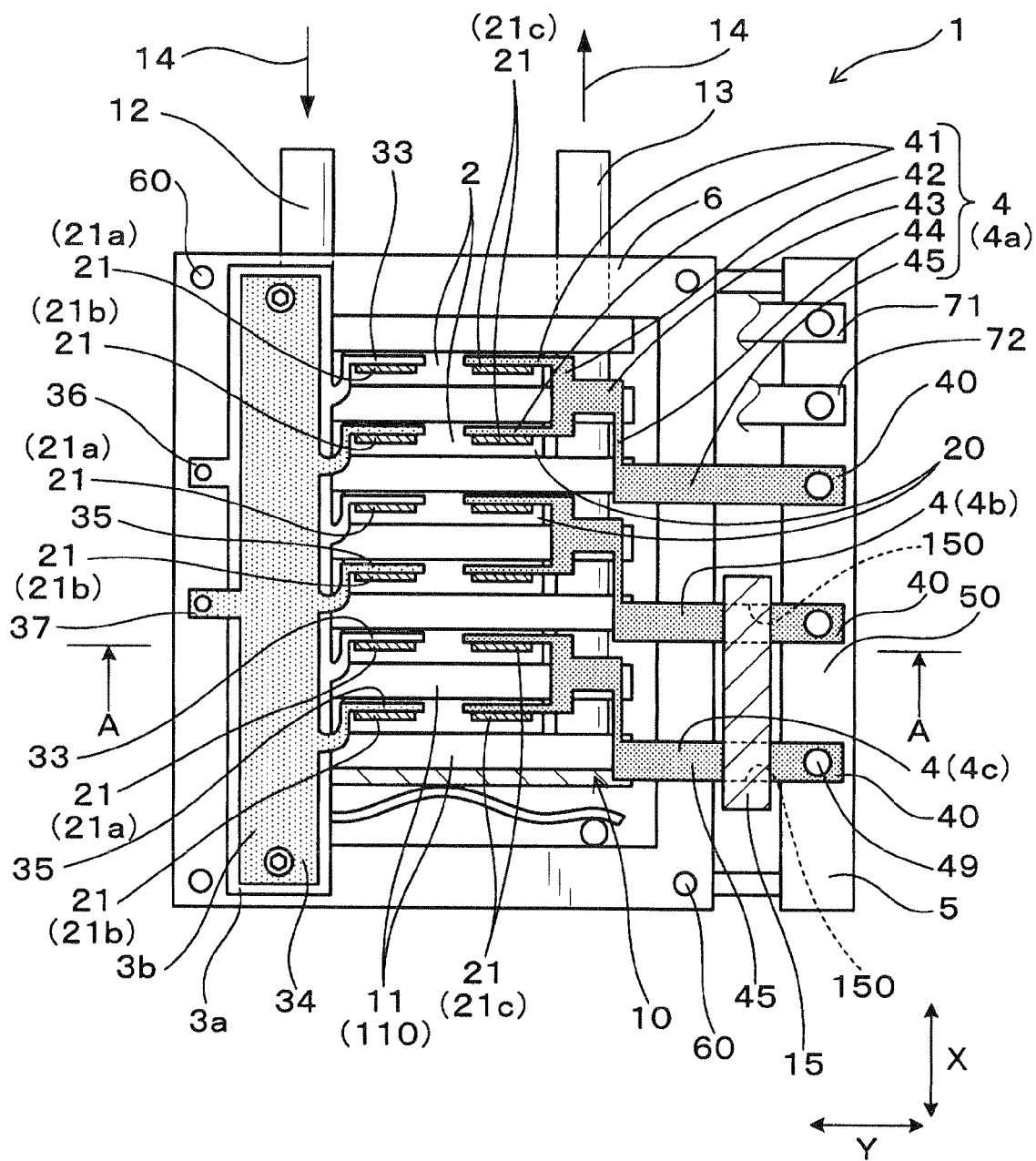
FIG. 1 is a plan view of a first embodiment of an electric power converter, as viewed from line B-B shown in FIG. 2.

A first embodiment of an electric power converter, designated by numeral 1, will be described referring to FIGS. 1-5.

The electric power converter 1 includes a stacked-layer unit 10 formed of six semiconductor modules 2 arrayed as successive layers along the x-direction (stacking direction). The layer positions of the semiconductor modules alternate with those of a plurality of cooling tubes 110, which are in contact with the semiconductor modules. A coolant 14 passes through flow passages 11 formed in the interiors of the cooling tubes 110, for cooling the semiconductor modules 2. Each semiconductor module 2 has a body 20 containing an internal semiconductor module 23 (see FIG. 5), with two power terminals protruding from the body 20, the power terminals being collectively designated by reference numeral 21. The power terminals 21 each extend in the z-direction (protrusion direction), at right angles to the x-direction.

A plurality of busbars (positive-polarity busbar 3a, negative-polarity busbar 3b, and three AC busbars 4) are connected to the power terminals 21 as described hereinafter. A terminal strip 5 is located adjacent one side of the stacked-layer unit 10, with respect to the y-direction (i.e., width direction, at right angles to the x-direction and z-direction). Respective external connection terminals 40 of the AC busbars 4 are mounted on a mounting face 50 of the terminal strip 5.

A DC current flows through the positive-polarity busbar 3a and negative-polarity busbar 3b, and AC currents flow through the AC busbars 4.

As shown, the semiconductor modules 2 are arrayed in a single column (alternating with the cooling tubes 110) which extends along the x-direction. The power terminals 21 of a semiconductor module 2 consist of a positive-polarity power terminal 21a and an AC terminal 21c, or a negative-polarity power terminal 21a and an AC terminal 21c, depending upon the layer position of the semiconductor module 2. The AC terminals 21c of each pair of layer-adjacent semiconductor modules 2 are connected in common to a corresponding one of the AC busbars 4. The positive-polarity and negative-polarity power terminals 21a, 21b, each extending in the x-direction, are located in the stacked-layer unit 10 close to the opposite side (with respect to the y-direction) of the stacked-layer unit 10 from the side that is adjacent to the terminal strip 5. The AC terminals 21c are located close to the side of the stacked-layer unit 110 that is adjacent to the terminal strip 5, arrayed in a single column extending in the x-direction.

Each positive-polarity power terminal 21a is connected to the positive-polarity busbar 3a, and each negative-polarity power terminal 21b is connected to the negative-polarity busbar 3b. The positive-polarity busbar 3a and the negative-polarity busbar 3b are separated by a fixed spacing, with respect to the z-direction (protrusion direction). More specifically, the negative-polarity busbar 3b is located directly above (parallel to) the positive-polarity busbar 3a, as shown in FIG. 2.

As shown in FIG. 1 the stacked-layer unit 10 is held within the inner periphery of a flat rectangular frame 6, i.e., having flat upper and lower faces and rectangular inner and outer peripheries. The terminal strip 5 is of elongated straight shape extending in the x-direction, and is attached to the frame 6, adjacent to one side of the frame 6, i.e., adjacent to one side of the stacked-layer unit 10 with respect to the y-direction. The respective lengths of the terminal strip 5 and of the frame 6 along the x-direction are substantially identical. Three external connection terminals 40 are mounted on the mounting face 50 of the terminal strip 5, together with terminals 71 and 72 of a smoothing capacitor 7. The external connection terminals 40 and the capacitor terminals 71, 72 are arrayed as a single column along the x-direction.

The positive-polarity and negative-polarity power terminals 21a and 21b of respective semiconductor modules 2 are positioned in successive alternation along the x-direction as shown in FIG. 1.

Figure 2:
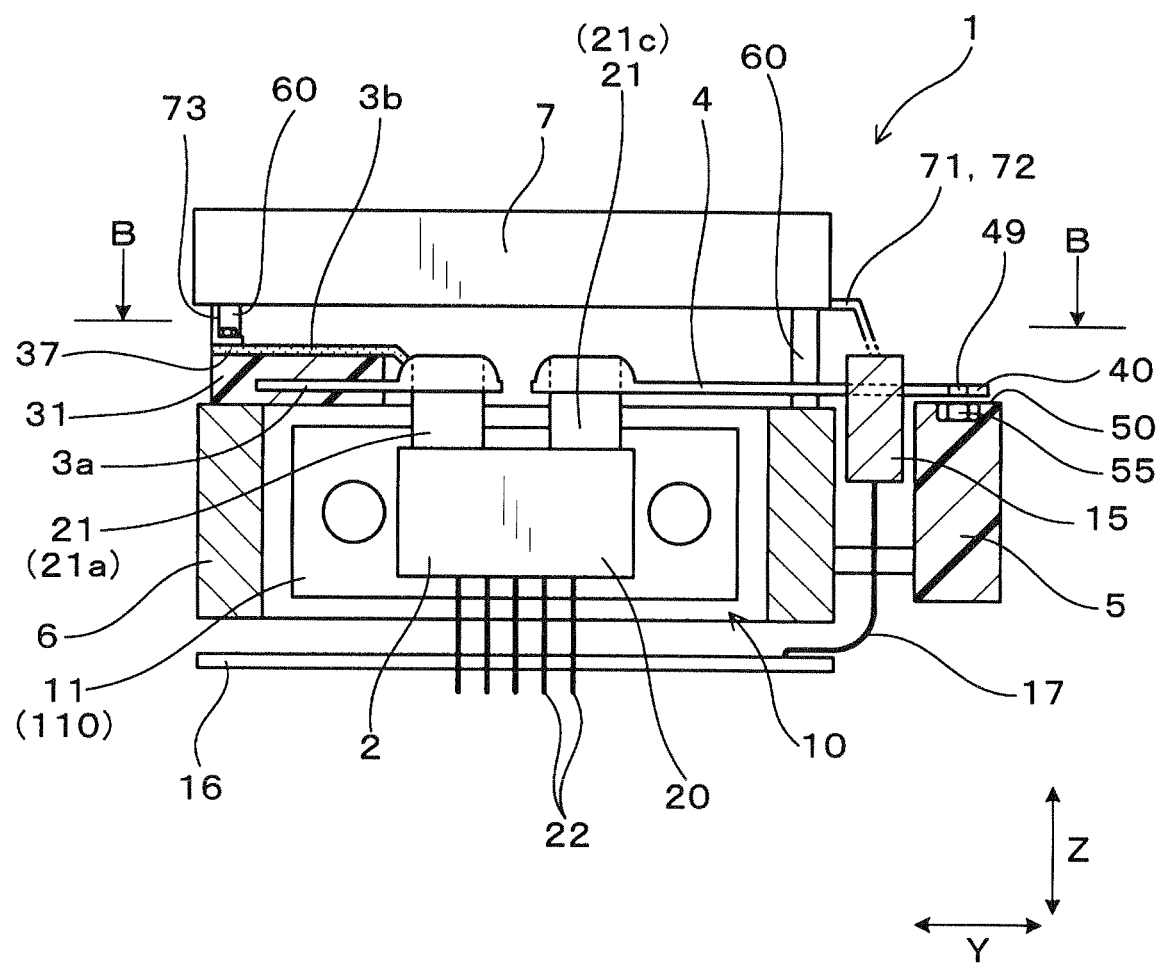
FIG. 2 is a cross-sectional view of the first embodiment, taken in a plane through line A-A in FIG. 1.

As shown in FIG. 2, each semiconductor module 2 is provided with a plurality of control terminals 22 in addition to the power terminals 21, the control terminals 22 being connected to a control circuit board 16. A control circuit (not shown in the drawings) formed on the control circuit board 16 transmits control signals via the control terminals 22, for controlling switching operations executed by the semiconductor modules 2. DC power from a DC power source 8 (see FIG. 5) is thereby converted to AC power which is outputted from the AC terminals 21c of the semiconductor modules 2.

Figure 3:
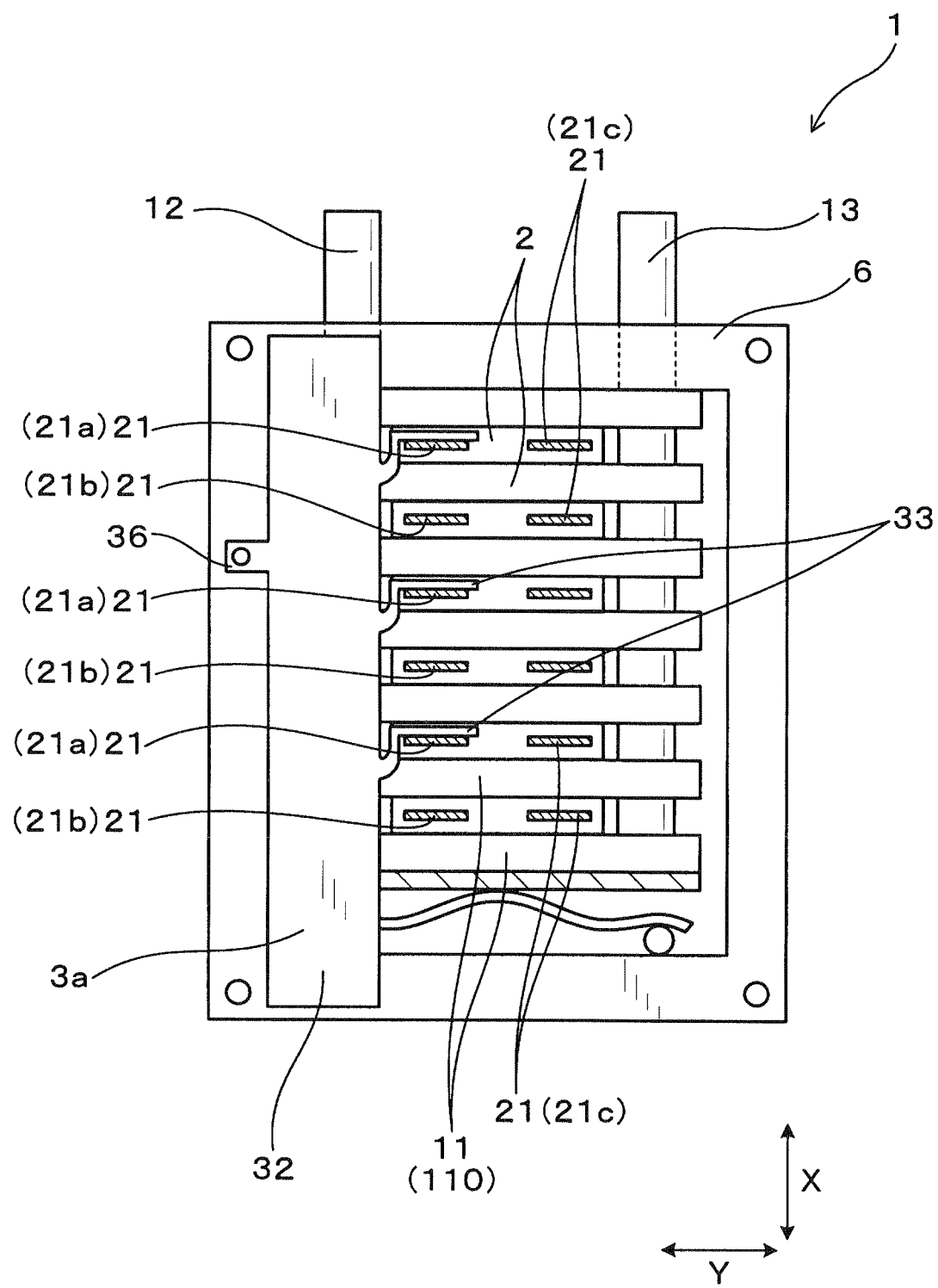
FIG. 3 is a plan view of the first embodiment with a negative-polarity busbar, AC busbars and a terminal strip removed.

As shown in FIG. 3, the positive-polarity busbar 3a is formed with a main body 32 which is of thin flat shape, three terminal connection portions 33 which each extend from the main body 32 along the y-direction, and a capacitor connection portion 36 for connecting the positive-polarity busbar 3a to the smoothing capacitor 7 (see FIG. 2). As shown in FIG. 1, the negative-polarity busbar 3b is similarly provided with a main body 34 having a thin flat shape, three terminal connection portions 35 which each extend from the main body 34 along the y-direction, and a capacitor connection portion 37 for connecting the negative-polarity busbar 3b to the smoothing capacitor 7. A part of the positive-polarity busbar 3a is sealed within a sealing member 31, formed of electrically insulating synthetic resin. The negative-polarity busbar 3b is mounted on an outer face of the sealing member 31.

The smoothing capacitor 7 is attached to the frame 6 by a plurality of pillars 60 which are mounted on the frame 6, each protruding in the z-direction as illustrated in FIG. 2. Terminals 71 and 72 provided on the smoothing capacitor 7 serve for connecting the smoothing capacitor 7 to the DC power source 8 (shown in FIG. 5), while two busbar connection portions 73 of the smoothing capacitor 7 serve for connecting the smoothing capacitor 7 to the positive-polarity and negative-polarity busbars 3a and 3b respectively. The busbar connection portions 73 are attached by bolts to the capacitor connectors 36 and 37 respectively of the positive-polarity and negative-polarity busbars 3a and 3b. The capacitor terminals 71 and 72 are mounted on the mounting face 50 of the terminal strip 5.

The external connection terminals 40 of the three AC busbars 4 constitute the U-phase, V-phase and W-phase output terminals of the 3-phase AC voltage that is produced by the electric power converter 1. Each of the AC busbars 4 is formed with two terminal connection portions 41, a coupling portion 42, a protrusion portion 43, an extension portion 44 and a terminal formation portion 45. Each protrusion portion 43 has two terminal connection portions 41, with each terminal connection portion 41 connected to a corresponding AC terminal 21c of a semiconductor module 2. Each protrusion portion 43 protrudes along the y-direction, from the coupling portion 42, towards the side of the frame 6 that is adjacent to the terminal strip 5. Each extension portion 44 extends, from the corresponding protrusion portion 43, in the x-direction. Each terminal formation portion 45 extends from the corresponding extension portion 44, in the y-direction, to the terminal strip 5. A tip portion of each terminal formation portion 45 constitutes an external connection terminal 40.

Each pair of terminal connection portions 41 of an AC busbar 4 are connected to respective AC terminals 21c of two layer-adjacent semiconductor modules 2 (i.e., adjacent along the x-direction), as shown in FIG. 1. The three AC busbars 4 are of identical form. Two of these, designated as 4b and 4c, are attached to a Hall effect type of current sensor 15. As shown in FIG. 2, the current sensor 15 and the control circuit board 16 are electrically connected by wiring leads 17. Values of current flow in the AC busbars 4, detected by the current sensor 15, are used by the circuit of the control circuit board 16 in controlling the operation of the semiconductor modules 2.

The current sensor 15 is positioned between the terminal strip 5 and the frame 6, with respect to the y-direction. Two through-holes 150 are formed in the current sensor 15, each extending in the y-direction, for accommodating the AC busbars 4b and 4c.

Through-holes 49 extending in the z-direction are formed in the external connection terminals 40 of the AC busbars 4, and nuts 50 are retained in the terminal strip 5 at positions corresponding to the through-holes 49, as shown in FIG. 2. Respective power supply terminals (not shown in the drawings) of the 3-phase AC motor 80 (see FIG. 5) are superimposed on the external connection terminals 40, and bolts are inserted via the respective through-holes 49 and screwed into the respective nuts 50 and tightened, for connecting the power supply terminals of the 3-phase AC motor 80 to respective external connection terminals 40.

Figure 4:
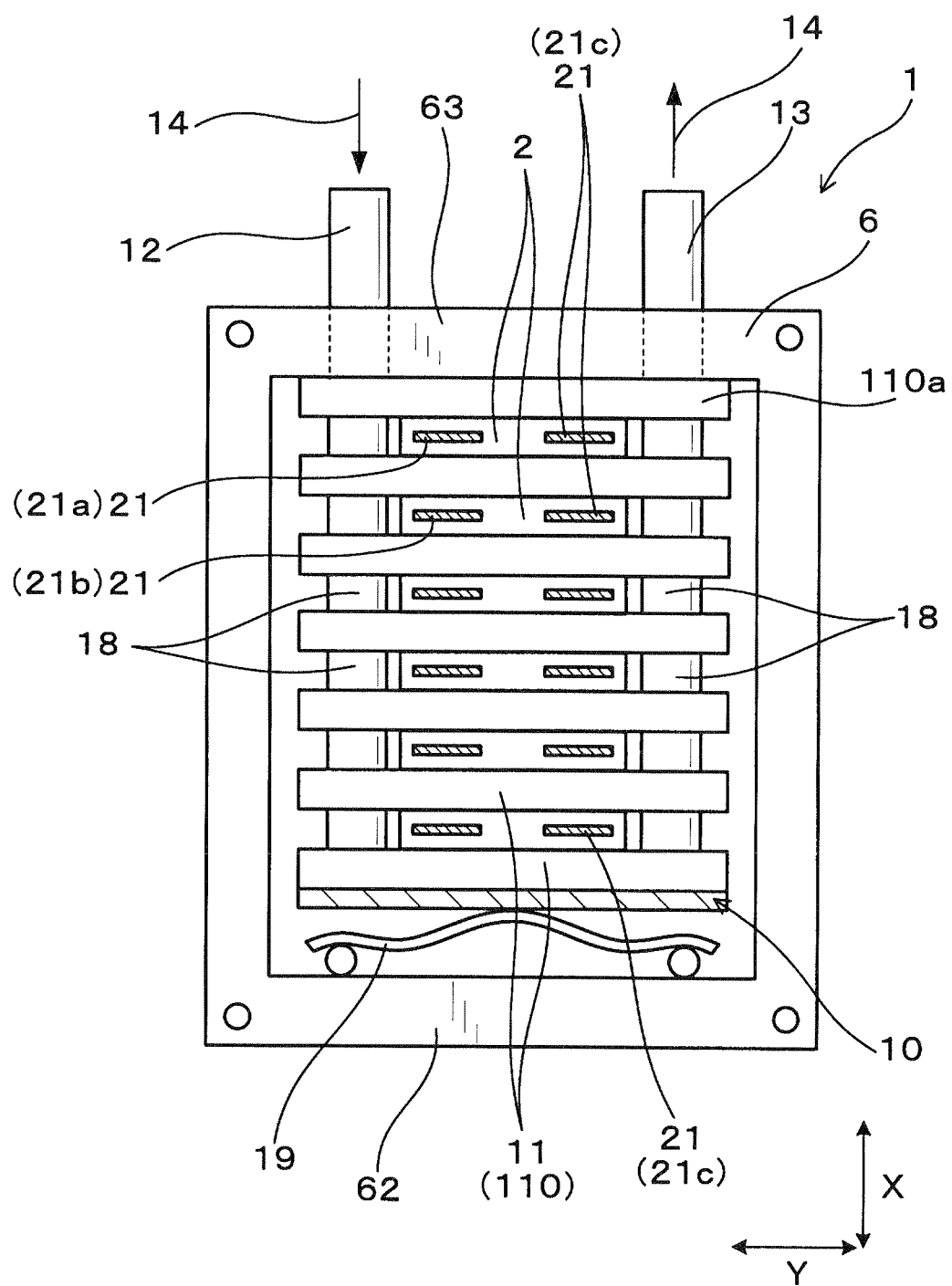
FIG. 4 is a plan view corresponding to FIG. 3, with a positive-polarity busbar also removed.

Referring to FIG. 4, a cooling tube designated as 110a, located at one end (with respect to the z-direction) of the column of cooling tubes 110, communicates with an intake pipe 12 and with a discharge pipe 13 through which the coolant 14 respectively enters and exits. The (y-direction) ends of each cooling tube 110 communicate with other cooling tubes 110 via connecting pipes 18 as shown. The coolant 14 thereby flows through each of the cooling tubes 110, to be discharged via the discharge pipe 13, thereby cooling the semiconductor modules 2.

The frame 6 contains a leaf spring 19 positioned between a wall section 62 of the frame 6 and the stacked-layer unit 10, with the leaf spring 19 held in a compressed state as shown in FIG. 4. The stacked-layer unit 10 is thereby held within the frame 6, by being pressed against the opposite wall section 63 of the frame 6 with a constant contact pressure.

With this embodiment, the leaf spring 19 is disposed between stacked-layer unit 10 and the wall section 62. However it would be equally possible for the leaf spring 19 to be disposed between stacked-layer unit 10 and the wall section 63, with the stacked-layer unit 10 thereby held pressed against the wall section 62.

Figure 5:
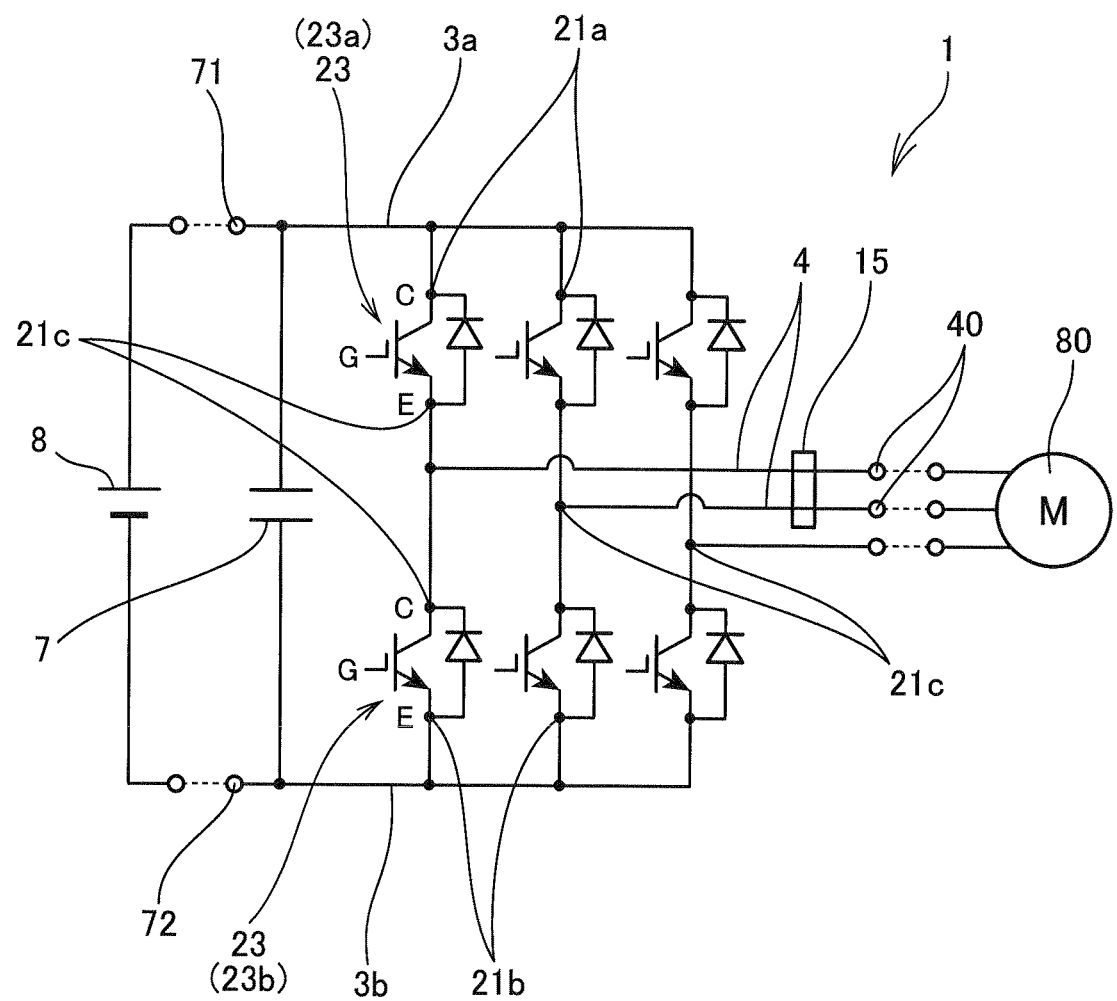
FIG. 5 is a circuit diagram of the first embodiment.

The electrical circuit of the electric power converter 1 is shown in FIG. 5. This contains six semiconductor elements 23, which with this embodiment are respective IGBTs (insulated-gate bipolar transistors), contained within the bodies of respective semiconductor modules 2. The semiconductor elements 23 consist of three upper arm-side semiconductor elements 23a which are each connected to the positive-polarity busbar 3a, and three lower arm-side semiconductor elements 23b which are each connected to the negative-polarity busbar 3b. The collector electrode of each of the upper arm-side semiconductor elements 23a is connected to the positive-polarity power terminal 21a of the corresponding semiconductor module 2, while the emitter electrode of each of the lower arm-side semiconductor elements 23b is connected to the negative-polarity power terminal 21b of the corresponding semiconductor module 2. For each pair of layer-adjacent semiconductor modules 2, the emitter electrode of the upper arm-side semiconductor elements 23b and the collector electrode of the lower arm-side semiconductor element 23b of that pair of semiconductor modules are connected to respective AC terminals 21c, which are connected in common to a corresponding AC busbar 4.

The positive-polarity busbar 3a and the negative-polarity busbar 3b are connected respectively to the positive-polarity and negative-polarity power terminals of the DC power source 8, while the three AC busbars 4 are connected to respective phase leads (U, V, W) of the 3-phase AC motor 80. The control circuit board 16 is connected via the control terminals 22 to respective control electrodes (gates electrodes) of the semiconductor modules 23.

The effects obtained by this embodiment are as follows. As shown in FIG. 1, the semiconductor modules 2, each having a pair of power terminals 21, are arrayed as successive layers which are stacked as a single column of semiconductor modules. The pairs of power terminals of the semiconductor modules 2 thereby form a first power terminal column, consisting of AC terminals, located at a side of the stacked-layer unit 10 adjacent to the terminal strip 5, and a second power terminal column, consisting of alternating positive-polarity and negative-polarity power terminals, located at the opposite side (with respect to the width direction) of the stacked-layer unit 10 from the first power terminal column, with the first and second power terminal columns each extending in the stacking direction. Each AC busbar is connected in common to the AC terminals of a pair of layer-adjacent semiconductor modules, i.e., which are mutually adjacent with respect to the stacking direction.

As a result, by comparison with the case in which such semiconductor modules are arranged in a plurality of adjacent columns, the width of the stacked-layer unit 10 (i.e., length along the y-direction) is reduced and the length along the x-direction is correspondingly increased.

The necessary length of the terminal strip 5 is determined by the number of external connection terminals 40 and the capacitor terminals 71, 72, and the required (x-direction) spacings between these. In particular, the separation between adjacent external connection terminals 40 is fixedly determined by the pitch of the through-holes 150 formed in the current sensor 15. However with the above embodiment, due to the increased (x-direction) length of the stacked-layer unit 10, the length of the frame 6 can be close to that of the terminal strip 5. The dead space S described above referring to FIG. 9 is thereby eliminated. The overall size of the electric power converter can thus be reduced.

Furthermore with this embodiment as shown in FIG. 2, the positive-polarity busbar 3a and the negative-polarity busbar 3b are positioned opposite one another (i.e., mutually parallel) with a fixed (z-direction) spacing between them. Hence the amount of stray inductance of the busbars 3a, 3b can be kept small, so that the amplitude of any surge voltages applied to the semiconductor elements 23 from these busbars can be kept small.

Moreover with this embodiment as shown in FIG. 1, all of the AC terminals 21c are arrayed in a single column. Thus by comparison with the case in which the AC terminals 921c are arrayed in two (side-by-side) columns as in the example of FIG. 9, each terminal connection portion 41 of the AC busbars 4 can be made short. As a result, the amount of metal required to produce the AC busbars 4 is reduced, enabling the manufacturing cost of the AC busbars 4 to be lowered, and the amount of stray inductance of the AC busbars 4 is reduced.

Furthermore with this embodiment as shown in FIG. 3, the positive-polarity power terminals 21a and negative-polarity power terminals 21b are arrayed in alternation along the x-direction. With such an arrangement, since each negative-polarity terminal 21b is located between two positive-polarity power terminals 21a, the spacing between each pair of positive-polarity power terminals 21a (along the x-direction) can be made wide. As a result, the terminal connection portions 33 which are formed on the positive-polarity busbar 3a for connecting to the positive-polarity power terminals 21a can be spaced widely apart along the x-direction. This is advantageous since, if that spacing is narrow, machining of sheet metal to form the positive-polarity busbars is made difficult, causing increased difficulty of manufacturing these busbars.

Similarly, manufacture of the negative-polarity busbars is facilitated, due to the wide spacing between each pair of negative-polarity power terminals 21b along the x-direction.

In addition since each of the AC busbars 4 (4a-4c) is connected to a corresponding pair of AC terminals 21c which are mutually adjacent along the x-direction, the (x-direction) spacing between the pair of terminal connection portions 41 can be made small. Hence, each coupling portion 42 can be made short. The amount of metal necessary to form each AC busbar can thereby be reduced, and the manufacturing cost lowered accordingly.

Furthermore, the extension portions 44 of respective AC busbars 4 are of identical size and shape. This enables each of the AC busbars 4 to be of identical size and shape, so that the manufacturing costs of the AC busbars can be further reduced.

Figure 9:
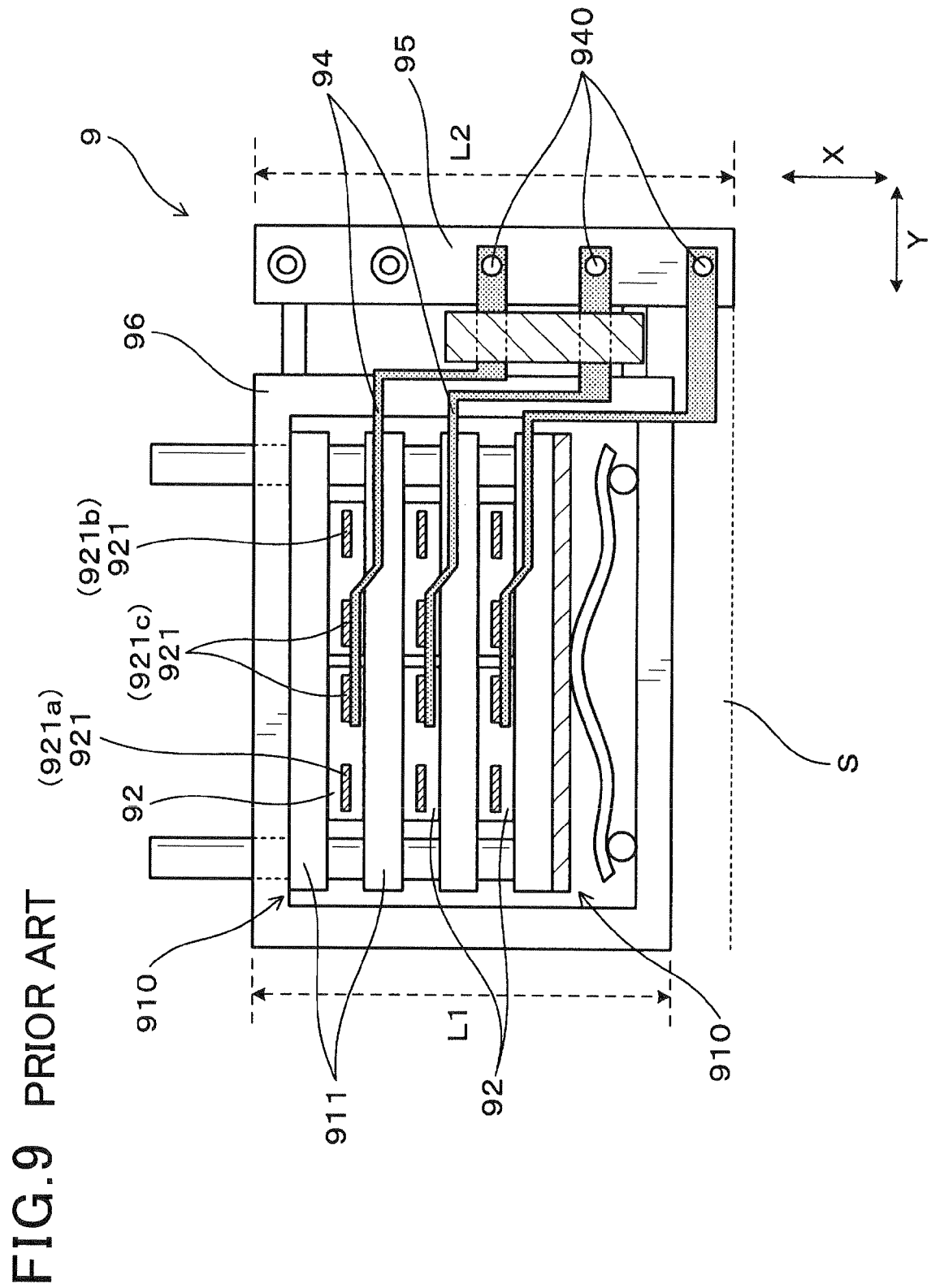
FIG. 9 is a plan view corresponding to FIG. 8 with negative-polarity and positive-polarity busbars removed.

However if the AC busbars of the prior art example of FIG. 9 were to be formed with extension portions of equal length, i.e., having the same x-direction length as the extension portions 44 of the above embodiment, contact would occur between adjacent AC busbars. This is due to the shorter x-direction length of the stacked-layer unit of the prior art example by comparison with the above embodiment. More specifically, with the arrangement of semiconductor modules and AC busbars shown in FIG. 9, if the pitch of the semiconductor module layers is less than the pitch of the external connection terminals of the AC busbars, it is impossible for each of the AC busbars to be of identical shape.

A further basic advantage of the above embodiment is that the no part of the AC terminals 21c or the AC busbars 4 is hidden by the positive-polarity busbar 3a or the negative-polarity busbar 3b. Hence during manufacture, the busbars can be installed in a single operation, and connections between the busbars and the power terminals of the semiconductor modules can similarly be performed in a single operation. However with the prior art example of FIG. 9, it is necessary to first install the AC busbar 94, then connect these to the AC terminals 921c, then install the positive-polarity and negative-polarity busbars 93a, 93b, and then connect these to the positive-polarity and negative-polarity power terminals 921a and 921b respectively. Hence the above embodiment provides greater manufacturing efficiency.

With the above embodiment, the coolant flow passages 11 are formed within the cooling tubes 110, which are disposed in contact with the semiconductor modules 2. However the invention is not limited to this, and for example it would be equally possible to form the coolant flow passages 11 such that the coolant 14 directly contacts the semiconductor modules 2. Hence the invention is not limited to any specific configuration for forming the coolant flow passages.

Second Embodiment

Figure 6:
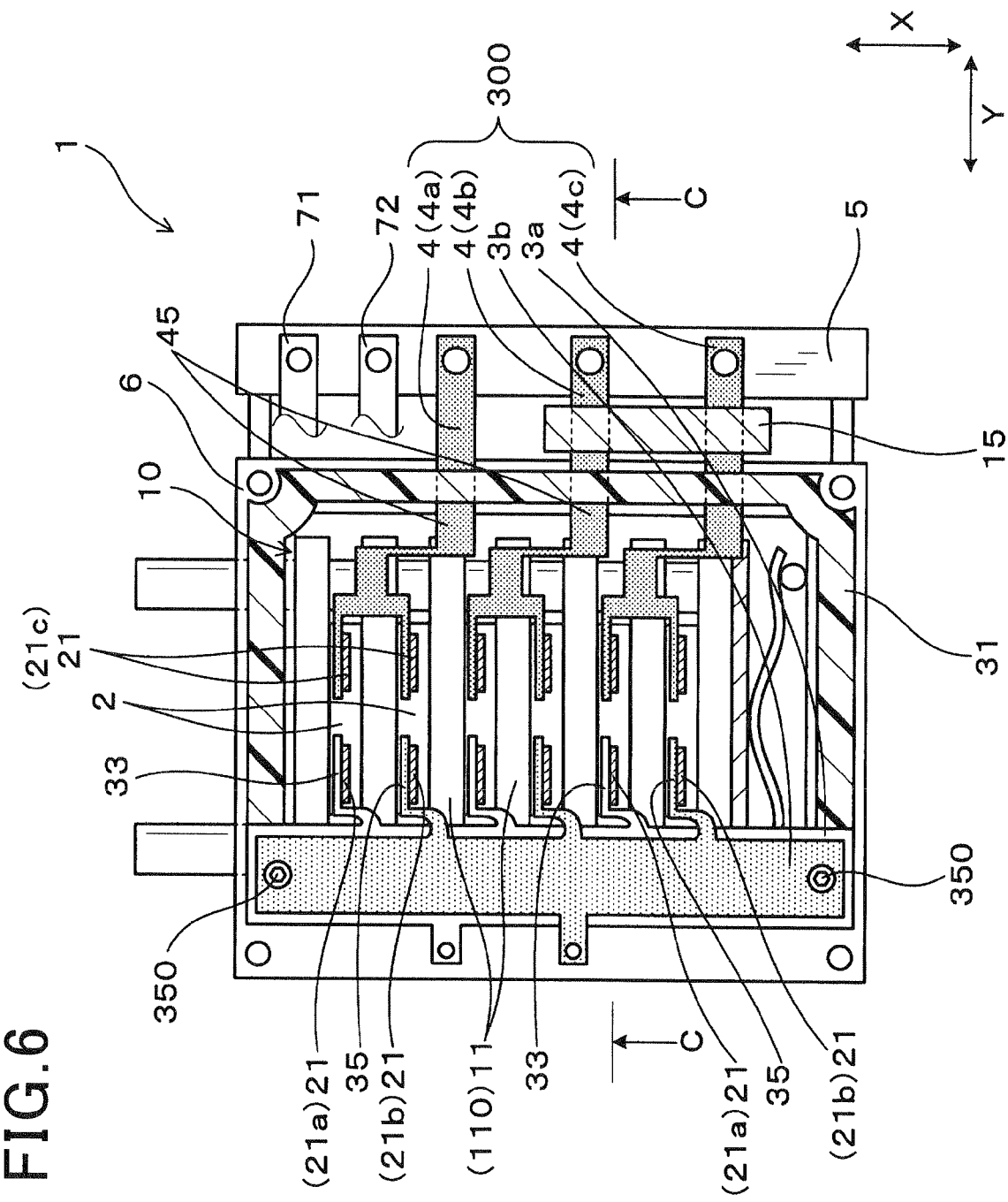
FIG. 6 is a plan view of a second embodiment of an electric power converter, as viewed from line D-D shown in FIG. 7.
Figure 7:
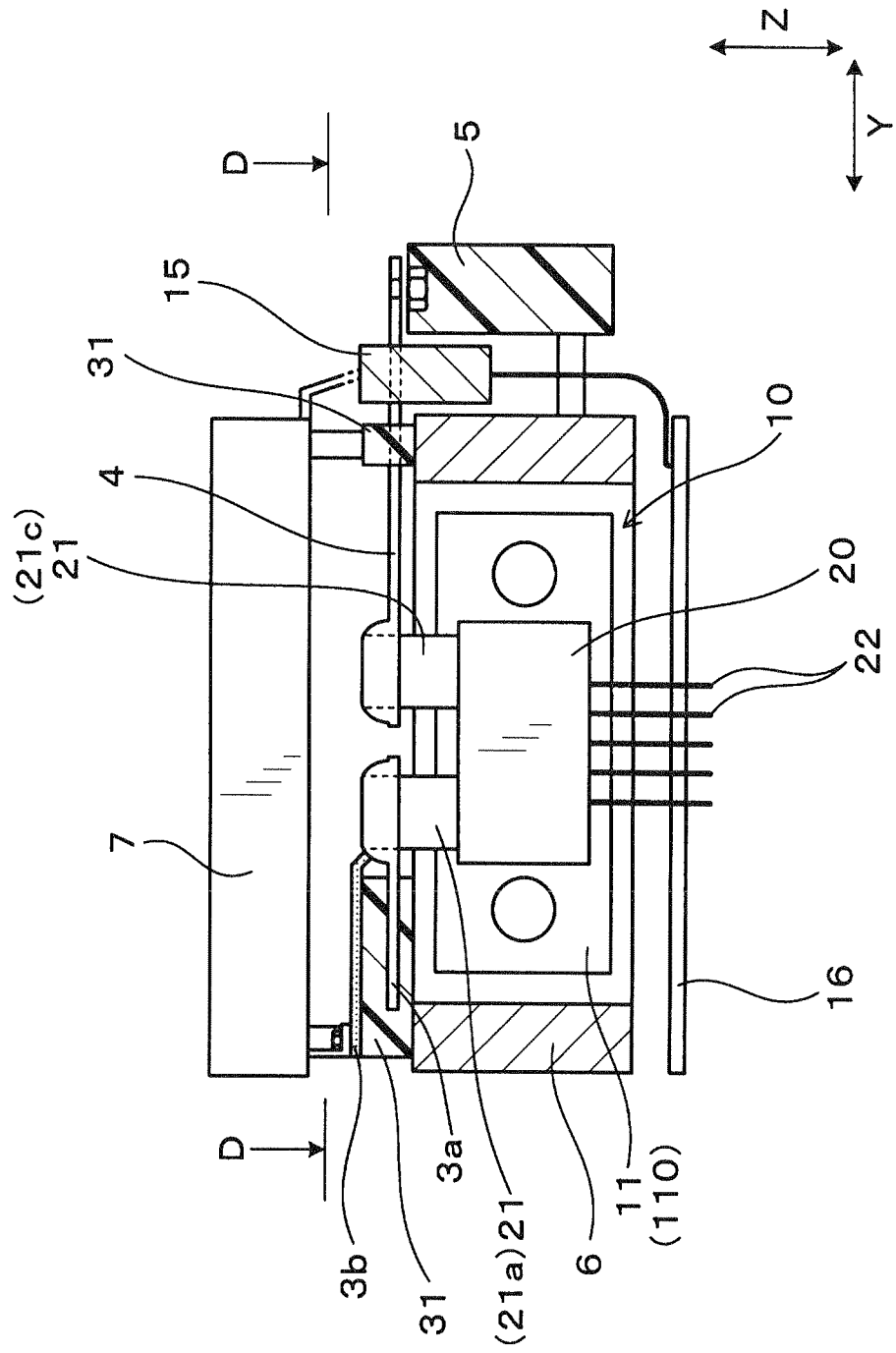
FIG. 7 is a cross-sectional view of the second embodiment, taken in a plane through line C-C in FIG. 6.
Figure 8:
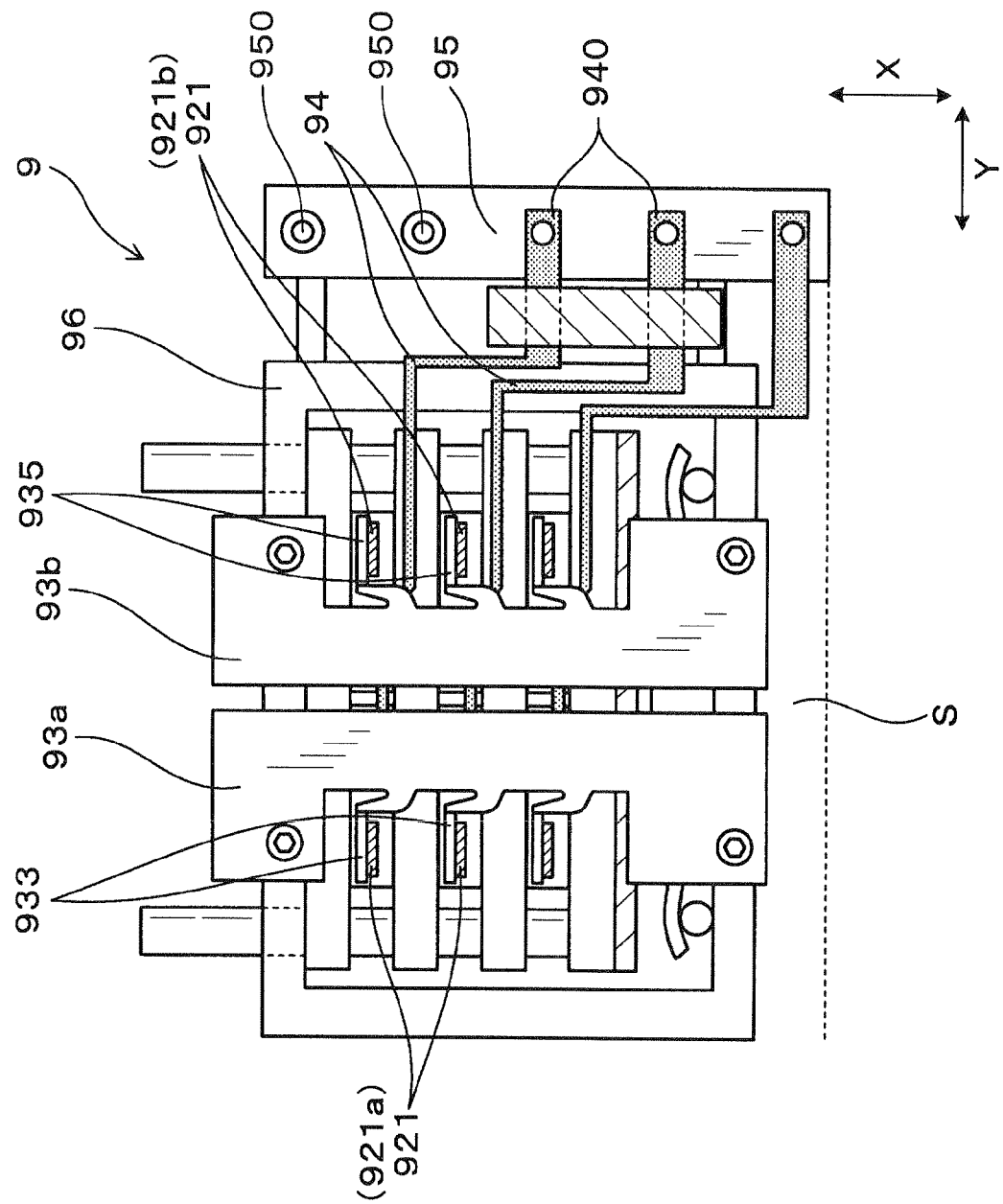
FIG. 8 is a plan view of an example of a prior art electric power converter.

A second embodiment will be described referring to FIGS. 6 and 7. Components corresponding to components of the first embodiment are indicated by identical reference numerals to those of the first embodiment, and only points of difference from the first embodiment will be described in detail. As shown, the sealing member 31 of the first embodiment is replaced by a sealing member 131 having a flat open rectangular shape, i.e., having substantially rectangular outer and inner peripheries as viewed in plan along the z-direction. The sealing member 131 retains not only the positive-polarity busbar 3a and negative-polarity busbar 3b as with the first embodiment, but also serves to retain each of the AC busbars 4 (4a-4b). Specifically, portions of the positive-polarity busbar 3a, and the terminal formation portions 45 of the AC busbars 4, are sealed within the sealing member 131, while the negative-polarity busbar 3b is mounted on an upper surface of the sealing member 131. A single integral unit (single component), designated as the busbar module 300, is thereby formed of the sealing member 131, positive-polarity busbar 3a, negative-polarity busbar 3b and AC busbars 4 in combination. The sealing member 131 (and hence the busbar module 300) is attached to the frame 6 by bolts 350.

The effects of the second embodiment are as follows. Since the plurality of busbars form part of a single unit (single component), the number of separate components which must be handled during manufacture (i.e., during assembly operations) is reduced. With the prior art example of FIG. 9, at the time of assembling the electric power converter 9, the positive-polarity busbar 93a, negative-polarity busbar 93b and the three AC busbars 94 must be handled as respectively separate components. In addition at that time (since the AC busbars 94 become partially hidden by the positive-polarity and negative-polarity busbars 93a and 93b after these are installed) it is necessary to first separately install and connect each of the AC busbars 94 to the AC terminals 921c, then separately install the positive-polarity and negative-polarity busbars 93a and 93b, then connect these to the positive-polarity and negative-polarity power terminals 921a, 921b. With the second embodiment of the present invention however, the busbar module 300 can be installed and connected in the same manner as a single component. Hence, manufacturing efficiency can be substantially improved.

In other respects, the features and advantages of the second embodiment are as described for the first embodiment above.

What is claimed is:

1. An electric power converter comprising:
    a stacked-layer unit comprising a plurality of semiconductor modules arrayed in layers along a stacking direction, and a plurality of coolant passages formed adjacent to said semiconductor modules and configured for passing a flow of a coolant to cool said semiconductor modules, each of said semiconductor modules comprising a body containing an internal semiconductor element, and having a pair of power terminals comprising an AC power terminal and a positive-polarity power terminal or a negative-polarity power terminal respectively protruding from said body along a protrusion direction at right angles to said stacking direction, the power terminals in each of said pairs being separated by a fixed spacing along a width direction at right angles to said stacking direction and to said protrusion direction;
    a positive-polarity busbar and a negative-polarity busbar for carrying a DC current, each of said negative-polarity busbar and said positive-polarity busbar comprising a main body having a thin flat shape, and connection portions extending from said main body, said connection portions of said negative-polarity busbar being respectively connected to said negative-polarity power terminals and said connection portions of said positive-polarity busbar being respectively connected to said positive-polarity power terminals;
    a plurality of AC busbars for carrying AC currents, connected to respective ones of said AC power terminals; and
    a terminal strip disposed adjacent to a first side of said stacked-layer unit and extending along said stacking direction, said terminal strip comprising a mounting face having external connection terminals mounted thereon, said AC power terminals being respectively connected via said AC busbars to said external connection terminals; wherein:
    said plurality of semiconductor modules are arrayed as a single column along said stacking direction, thereby forming a first column of power terminals extending along said stacking direction adjacent to said first side of said stacked-layer unit, and forming a second column of power terminals extending along said stacking direction adjacent to a second side of said stacked-layer unit, said second side being opposite said first side of the stacked-layer unit with respect to said width direction;
    said first column of power terminals comprises said AC power terminals;
    said second column of power terminals comprises said positive-polarity power terminals and said negative-polarity power terminals arrayed at successively alternating positions along said stacking direction;
    said negative-polarity busbar and said positive-polarity busbar are disposed directly opposite on another with respect to said protrusion direction and separated by a fixed spacing with respect to said protrusion direction and are located adjacent to said second side of said stacked-layer unit.

2. The electric power converter according to claim 1, wherein each of said AC busbars is connected to a corresponding pair of said AC terminals, said corresponding pair of AC terminals being disposed mutually adjacent with respect to said stacking direction.

3. The electric power converter according to claim 1 wherein:
    each of said AC busbars comprises a connection terminal portion connected to at least one of said power terminals, and is formed with an extension portion, said extension portion being located between said power terminal(s) and one of said external connection terminals, and extending in said stacking direction; and
    all of said AC busbars are respectively identical.

4. The electric power converter according to claim 1, comprising a smoothing capacitor disposed adjacent to a same side of said stacked-layer unit as a side from which said power terminals protrude, said smoothing capacitor comprising a pair of terminals respectively mounted on said mounting face of said terminal strip, said pair of terminals of said smoothing capacitor and said external connection terminals being arrayed in a single column along said stacking direction.

* * * * *